(12) United States Patent
Yin et al.

(10) Patent No.: US 10,609,842 B2
(45) Date of Patent: Mar. 31, 2020

(54) STORAGE ASSEMBLY AND STORAGE MODULE STRUCTURE THEREOF

(71) Applicant: ADATA TECHNOLOGY CO., LTD., New Taipei (TW)

(72) Inventors: Yung-Hsing Yin, New Taipei (TW); Jen-Chieh Pan, New Taipei (TW)

(73) Assignee: ADATA TECHNOLOGY CO., LTD., New Taipei (TW)

( * ) Notice: Subject to any disclaimer, the term of this patent is extended or adjusted under 35 U.S.C. 154(b) by 24 days.

(21) Appl. No.: 16/018,824

(22) Filed: Jun. 26, 2018

(65) Prior Publication Data

US 2019/0269036 A1    Aug. 29, 2019

(30) Foreign Application Priority Data

Feb. 23, 2018 (TW) .............................. 107106152 A

(51) Int. Cl.
| | |
|---|---|
| *G11C 5/02* | (2006.01) |
| *H05K 7/20* | (2006.01) |
| *H05K 9/00* | (2006.01) |
| *G11C 5/04* | (2006.01) |
| *G11C 11/34* | (2006.01) |
| *G11C 7/04* | (2006.01) |

(52) U.S. Cl.
CPC ........... *H05K 7/20409* (2013.01); *G11C 5/04* (2013.01); *G11C 7/04* (2013.01); *G11C 11/34* (2013.01); *H05K 9/0071* (2013.01)

(58) Field of Classification Search
CPC ........... G11C 7/02; G11C 5/063; G11C 11/16; G11C 5/005; G11C 5/025

USPC ....................................................... 365/51, 63
See application file for complete search history.

(56) References Cited

U.S. PATENT DOCUMENTS

| | | | |
|---|---|---|---|
| 6,535,387 B2 | 3/2003 | Summers et al. | |
| 6,888,719 B1 | 5/2005 | Janzen et al. | |
| 2010/0157544 A1* | 6/2010 | Tsao ................... | H05K 7/20454 361/720 |
| 2013/0168040 A1* | 7/2013 | Guckert ................... | F24D 3/14 165/49 |

FOREIGN PATENT DOCUMENTS

TW            433482           5/2001

\* cited by examiner

*Primary Examiner* — Son T Dinh
(74) *Attorney, Agent, or Firm* — Li & Cai Intellectual Property (USA) Office

(57) ABSTRACT

A storage module structure of a storage assembly includes an upper shielding component, a lower shielding component and a memory component. An outer surface of the upper shielding component has a plurality of heat-conducting units. The lower shielding component is located above the upper shielding component, and an accommodating space is defined between the upper shielding component and the lower shielding component. The memory component is located in the accommodating space. The heat-conducting units contact an external structure, and a thermal energy generated by the memory component is conducted to the external structure through the plurality of heat-conducting units.

10 Claims, 10 Drawing Sheets

STORAGE ASSEMBLY AND STORAGE MODULE STRUCTURE THEREOF

CROSS-REFERENCE TO RELATED PATENT APPLICATION

This application claims the benefit of priority to Taiwan Patent Application No. 107106152, filed on Feb. 23, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a storage assembly and a storage module structure thereof, and more particularly to a heat-dissipating storage system and a storage module structure thereof.

BACKGROUND OF THE DISCLOSURE

Hard disks are a main medium for computer storage. Hard disks include solid state drives (SSD). A solid state disk is a hard disk including a solid electronic storage chip array. The internal structure of a solid state disk is rather less complicated, with its main body being a circuit board. The most basic components on the circuit board include control chips, memory chips and other auxiliary circuits. Due to the high access speed of SSD devices, more and more traditional hard disk devices have been replaced by SSD devices.

The circuit module of a conventional SSD is manufactured by directly soldering control chips, storage chips and other circuit components on the circuit board, and assembling the SSD with a corresponding shell. However, after being used for a period of time, SSDs often have overheating problems due to temperature increases in internal components, which can easily affect the operational efficiency of the SSDs.

Therefore, there is still room for structural improvements for increasing the heat dissipation effect of a storage module structure.

SUMMARY OF THE DISCLOSURE

In response to the above-referenced technical inadequacies, the present disclosure provides a storage assembly and a storage module structure thereof.

In certain aspects, the present disclosure directs to a storage module structure including an upper shielding component, a lower shielding component and a memory component. The upper shielding component has an outer surface. The outer surface is formed with a plurality of protruding heat-conducting units. The lower shielding component is located above the upper shielding component. An accommodating space is defined between the upper shielding component and the lower shielding component. The memory component is located in the accommodating space. The heat-conducting units are in contact with an external structure. A thermal energy generated by the memory component is conducted to the external structure through the contact of the plurality of heat-conducting units with the external structure.

In certain aspects, the present disclosure directs to a storage assembly including an assembly body and a plurality of storage module structures. The assembly body has a first accommodating space. The storage module structures are disposed in the first accommodating space and adjacent to each other. Each storage module structure includes an upper shielding component, a lower shielding component and a memory component. The upper shielding component has an outer surface. The outer surface is formed with a plurality of protruding heat-conducting units. The lower shielding component is located above the upper shielding component. A second accommodating space is defined between the upper shielding component and the lower shielding component. The memory component is located in second the accommodating space. Every two adjacent storage module structures contact each other through corresponding heat-conducting units. The upper shielding component and the lower shielding component receive a thermal energy generated by the memory component, and the thermal energy is conducted from one storage module structure to another adjacent storage module structure through the heat-conducting units of the upper shielding component.

One of the beneficial effects of the present disclosure is that, through the technical features of "the outer surface of the upper shielding component has a plurality of protruding heat-conducting units," "the thermal energy generated by the memory component is conducted to the external structure through the contact of the plurality of heat-conducting units with the external structure," and "the upper shielding component and the lower shielding component of each storage module structure receive the thermal energy generated by the memory component, and the thermal energy is conducted away from one storage module structure to another adjacent storage module structure through the plurality of heat-conducting units of the upper shielding component," the storage module structure and the storage assembly provided by the present disclosure have increased heat-dissipating efficiency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
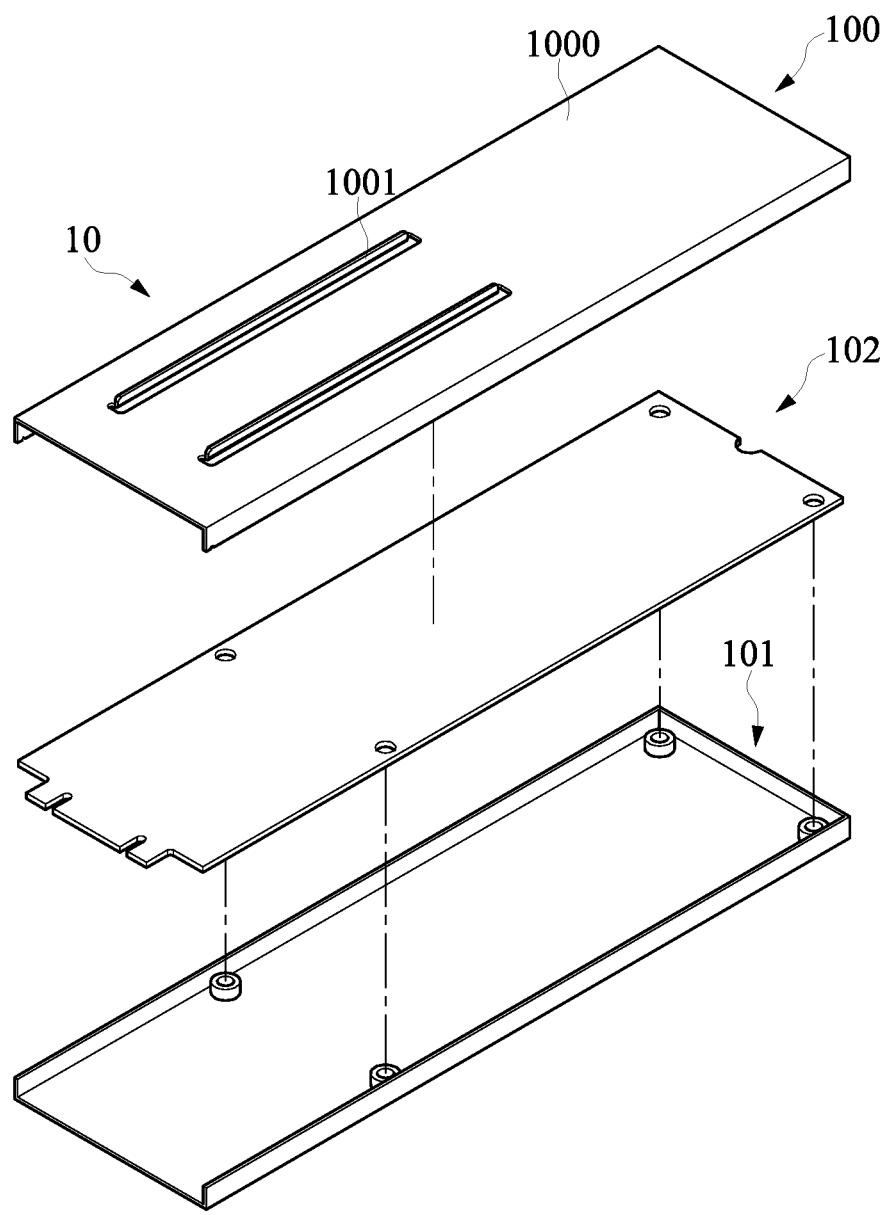
FIG. 1 is a perspective exploded view of a storage module structure according to a first embodiment of the present disclosure.

The present disclosure is more particularly described in the following examples that are intended as illustrative only since numerous modifications and variations therein will be apparent to those skilled in the art. Various embodiments of the present disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the present disclosure, and in the specific context where each term is used. Certain terms that are used to describe the present disclosure are discussed below, or elsewhere in the specification, to provide additional guidance to the practitioner regarding the description of the present disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing may be expressed in more than one way. Consequently, alternative language and synonyms may be used for any one or more of the terms discussed herein, and no special significance is to be placed upon whether or not a term is elaborated or discussed herein. Synonyms for certain terms may be provided. A recital of one or more synonyms does not exclude the use of other synonyms. The use of examples anywhere in this specification including examples of any terms discussed herein is illustrative only, and in no way limits the scope and meaning of the present disclosure or of any exemplified term. Likewise, the present disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including any definitions given herein, will prevail.

While numbering terms such as "first", "second" or "third" may be used in this disclosure to describe various components, signals or the like, the terms are for distinguishing one component from another component, or one signal from another signal only, and are not intended to, nor should they be construed to impose any other substantive descriptive limitations on the components, signals or the like.

First Embodiment

Referring to FIG. 1 to FIG. 4, which are respectively a perspective exploded view, another perspective exploded view, a perspective assembled view, and a front view of a storage module structure according to a first embodiment of the present disclosure. As shown in the above-referenced drawings, a first embodiment of the present disclosure provides a storage module structure 10 including an upper shielding component 100, a lower shielding component 101 and a memory component 102. The outer surface 1000 of the upper shielding component 100 has a plurality of protruding heat-conducting units 1001 thereon. The lower shielding component 101 is located above the upper shielding component 100, and an accommodating space 103 is defined between the lower shielding component 101 and the upper shielding component 100. The memory component 102 is located in the accommodating space 103. The plurality of heat-conducting units 1001 are in contact with an external structure 2, and a thermal energy generated by the memory component 102 is conducted to the external structure 2 through the contact of the plurality of heat-conducting units 1001 with the external structure 2.

Specifically, the storage module structure 10 of the present disclosure includes the upper shielding component 100, the lower shielding component 101, and the memory component 102. In certain embodiments, each of the upper shielding component 100 and the lower shielding component 101 is a shell structure and is made of a material with a high thermal conductivity, such as a metal material. The memory component 102 can be a storage component of a SSD such as a Next Generation Form Factor (NGFF, also known as M.2) or a Next Generation Small Form Factor (NGSFF, also known as M.3). However, the present disclosure is not limited thereto.

Figure 2:
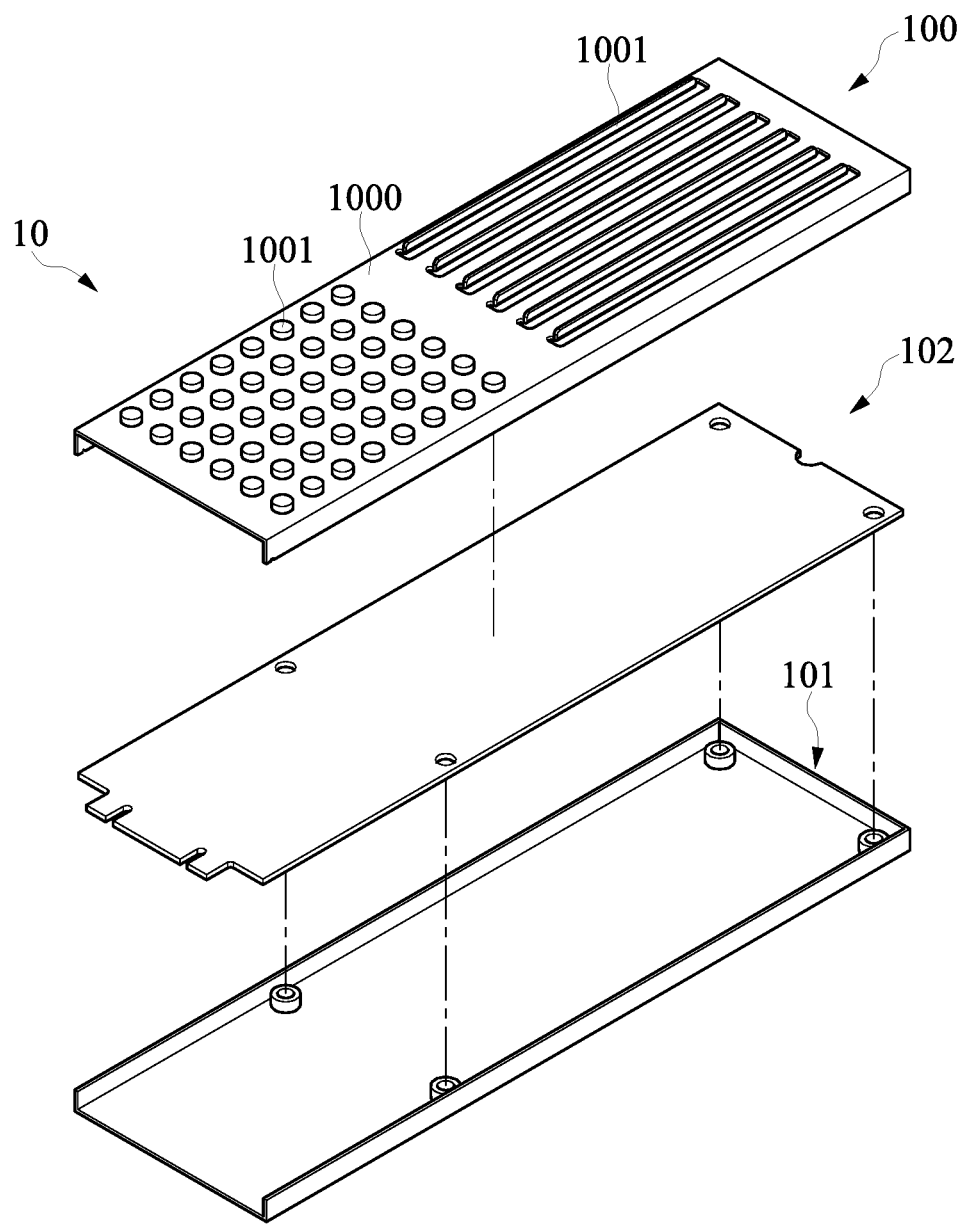
FIG. 2 is another perspective exploded view of the storage module structure according to the first embodiment of the present disclosure.
Figure 3:
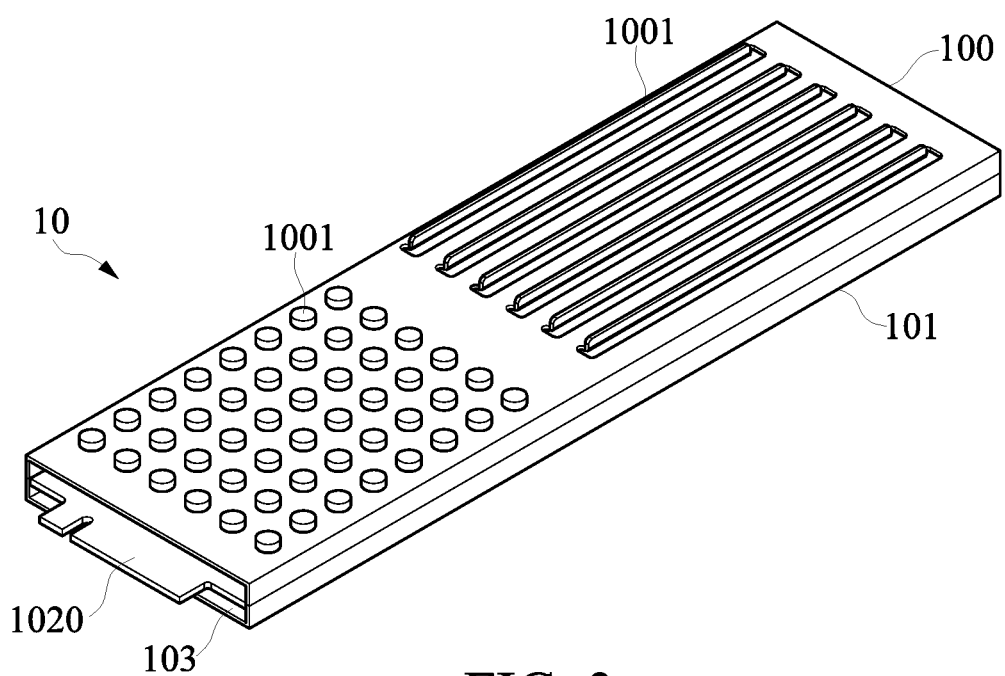
FIG. 3 is a perspective assembled view of the storage module structure according to the first embodiment of the present disclosure.
Figure 4:
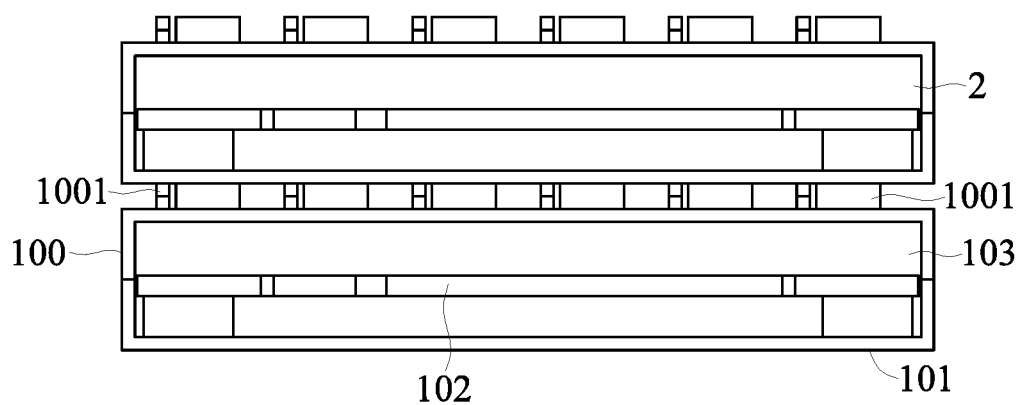
FIG. 4 is a front view of the storage module structure according to the first embodiment of the present disclosure.

The outer surface 1000 of the upper shielding component 100 has a plurality of outwardly protruding heat-conducting units 1001. Each of the heat-conducting units 1001 can be in an elongated or strip shape, collectively, a strip shape (as shown in FIG. 1), or in a cylindrical shape (as shown in FIG. 2). In certain embodiments, at least one heat-conducting unit 1001 is in a strip shape, and at least one heat-conducting unit 1001 is in a cylindrical shape (as shown in FIG. 2). However, the present disclosure is not limited thereto. In practical usage, a heat-conducting unit 1001 can be a structure in other three-dimensional geometric shapes. In certain embodiments, only a part of the outer surface 1000 of the upper shielding component 100 is provided with the heat-conducting unit(s) 1001 (as shown in FIG. 1). Alternately, the entire outer surface 1000 of the upper shielding component 100 can be provided with the heat-conducting units 1001 (as shown in FIG. 2). However, the present disclosure is not limited thereto. In practical usage, the heat-conducting unit(s) can be provided on the outer surface 1000 in many arrangements based on the needs of an implementer. Further, the accommodating space 103 is defined between the upper shielding component 100 and the lower shielding component 101 for accommodating the memory component 102.

Therefore, a user can place the memory component 102 in the accommodating space 103 and cover the memory component 102 with the upper shielding component 100 and the lower shielding component 101. The upper shielding component 100 and the lower shielding component 101 can be jointed through adhering, clasping or fastening mechanisms. However, the present disclosure is not limited thereto. Further, after the storage module structure 10 is connected to a circuit board (not shown) through at least one connection port 1020 of the memory component 102, the connecting causes the plurality of heat-conducting units 1001 on the storage module structure 10 to contact the external structure 2 (which can be another storage module structure disposed adjacent to the storage module structure 10; however, the present disclosure is not limited thereto, and in practical usage, it can be any electronic component). Then, when the memory component 102 generates thermal energy due to its operation, as the upper shielding component 100 and the lower shielding component 101 are in contact with the memory component 102, and the memory component 102 is disposed in the accommodating space 103 between the upper shielding component 100 and the lower shielding component 101, the thermal energy can be conducted away from the memory component 102 and to the upper shielding component 100 and the lower shielding component 101 either directly or through air. After the upper shielding component 100 and the lower shielding component 101 receive the thermal energy of the memory component 102, the thermal energy can be further conducted to the external structure 2 through the plurality of heat-conducting units 1001 on the upper shielding component 100.

Thereby, through the above-referenced structural design and heat-conducting manner of the heat-conducting unit 1001, the storage module structure 10 of the present disclosure can significantly reduce the operating temperature of the memory component 102, improve the heat dissipation efficiency of the storage module structure 10, and prevent the operational efficiency of the memory component 102 from being affected by the memory component 102's overheating.

Second Embodiment

Figure 5:
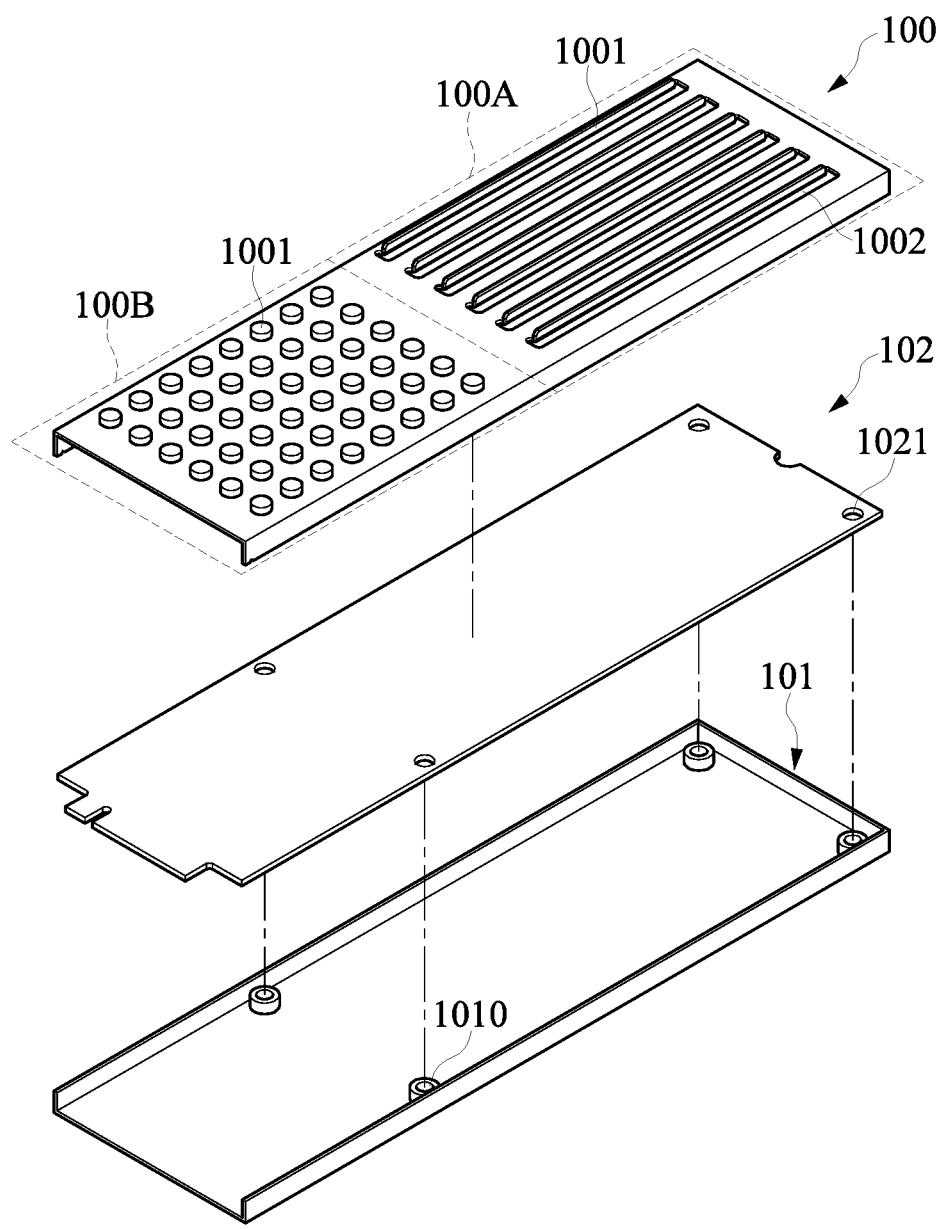
FIG. 5 is a perspective exploded view of a storage module structure according to a second embodiment of the present disclosure.
Figure 6:
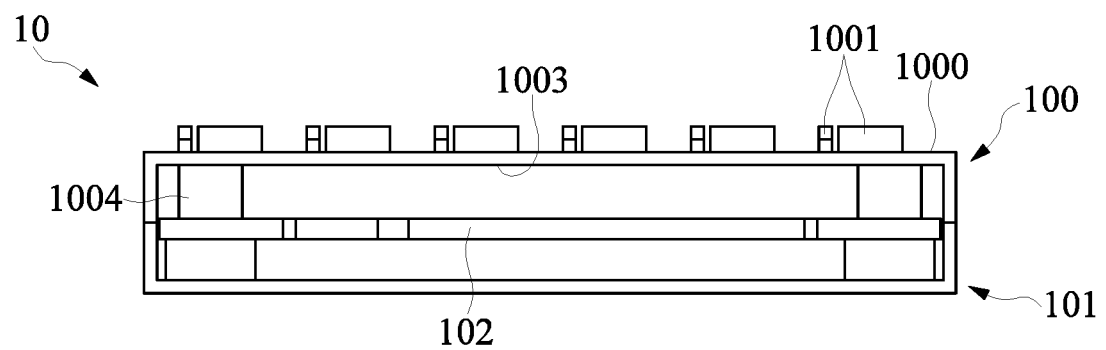
FIG. 6 is a front view of the storage module structure according to the second embodiment of the present disclosure.

Reference is made to FIG. 5 and FIG. 6, which are respectively a perspective exploded view and a front view of a storage module structure according to a second embodiment of the present disclosure. Reference is also made to FIGS. 1 to 4. The operation of certain components of the storage module structure in this embodiment is similar to that of their counterparts in the first embodiment, which is therefore not described herein again. It should be noted that in the present embodiment, the upper shielding module 100 has a first heat-dissipating region 100A and a second heat-dissipating region 100B. The heat-conducting unit(s) 1001 located in the first heat-dissipating region 100A is in a strip shape, and the heat-conducting unit(s) 1001 located in the second heat-dissipating region 100B is in a cylindrical shape.

For example, the outer surface 1000 of the upper shielding component 100 of the storage module structure 10 of the present disclosure can be divided into the first heat-dissipating region 100A and the second heat-dissipating region 100B. The heat-conducting unit 1001 located in the first heat-dissipating region 100A can have a strip shape, and the heat-conducting unit 1001 located in the second heat-dissipating region 100B can have a cylindrical shape. However, embodiments of the storage module structure 10 of the present disclosure are not limited thereto. In certain embodiments, the storage module structure 10 of the present disclosure has strip-shaped heat-conducting units 1001 disclosure both in the first heat-dissipating region 100A and the second heat-dissipating region 100B, or cylindrical heat-conducting units 1001 disposed both in the first heat-dissipating region 100A and the second heat-dissipating region 100B. In certain embodiments, the heat-conducting units 1001 in the first heat-dissipating region 100A and the second heat-dissipating region 100B include at least one strip-shaped heat-conducting unit 1001 and at least one cylindrical heat-conducting unit 1001, and the at least one strip-shaped heat-conducting unit 1001 and the at least one cylindrical heat-conducting unit 1001 are alternately arranged. In addition, in other embodiments, the heat-conducting units 1001 are structures having other kinds of three-dimensional geometric shapes, and the heat-dissipating unit(s) 1001 disposed in the first heat-dissipating region 100A has the same structure as or different structure from that disposed in the second heat-dissipating region 100B.

In certain embodiments, the heat-conducting unit(s) 1001 has a strip shape, and the outer surface 1000 of the upper shielding component 100 further has at least one opening 1002. The at least one opening 1002 is adjacent to the at least one heat-conducting unit 1001, and the memory unit 102 is exposed through the at least one opening 1002. In other words, the upper shielding component 100 of the present disclosure further includes at least one opening 1002 which is disposed adjacent to the strip-shaped heat-conducting unit 1001, and the memory unit 102 is exposed through the at least one opening 1002. The accommodating space 103 communicates with the outside world through the opening 1002. Therefore, during the operation of the memory component 102, the outside air flows into the accommodating space 103 through the opening 1002 to remove the thermal energy generated by the memory component 102 from the memory component 102 and the accommodating space 103.

In certain embodiments, the upper shielding component 100 further has an inner wall surface 1003 facing the lower shielding component 102. A plurality of first engaging portions 1004 protruding toward the lower shielding component 101 are formed on the inner wall surface 1003. The memory component 102 has a plurality of openings 1021, and the plurality of openings 1021 correspond to the plurality of first engaging portions 1004. A plurality of second engaging portions 1010 protruding toward the inner wall surface 1003 are formed on a surface of the lower shielding component 101 corresponding to the inner wall surface 1003. The plurality of second engaging portions 1010 respectively correspond to the openings 1021. Each first engaging portion 1004 can detachably engage with a corresponding second engaging portion 1010 through a corresponding opening 1021.

Specifically, the upper shielding component 100 further has the plurality of first engaging portions 1004 formed on and protruding away from the inner wall surface 1003. The plurality of second engaging portions 1010 are formed on and protruding away from the surface of the lower shielding component 101 corresponding to the inner wall surface 1003. The second engaging portions 1010 respectively correspond to the first engaging portions 1004. The plurality of openings 1021 are formed on the memory component 102, and correspond to the second engaging portions 1010 and the first engaging portions 1004. Accordingly, when assembled, each of the first engaging portions 1004 of the storage module structure 10 of the present disclosure is engaged with a corresponding second engaging portion 1010 through a corresponding opening 1021, so that the memory component 102 is covered by the upper shielding component 100 and the lower shielding component 101.

It is noted that the first engaging portion 1004 can have a tenon structure, the second joint portion 1010 can have a mortise structure, and the first joint portion 1004 is wedged in the second joint portion 1010. However, the present disclosure is not limited thereto. The first joining portion 1004 can be detachably engaged with the second joining portion 1010 through other jointing manners.

Third Embodiment

Figure 7:
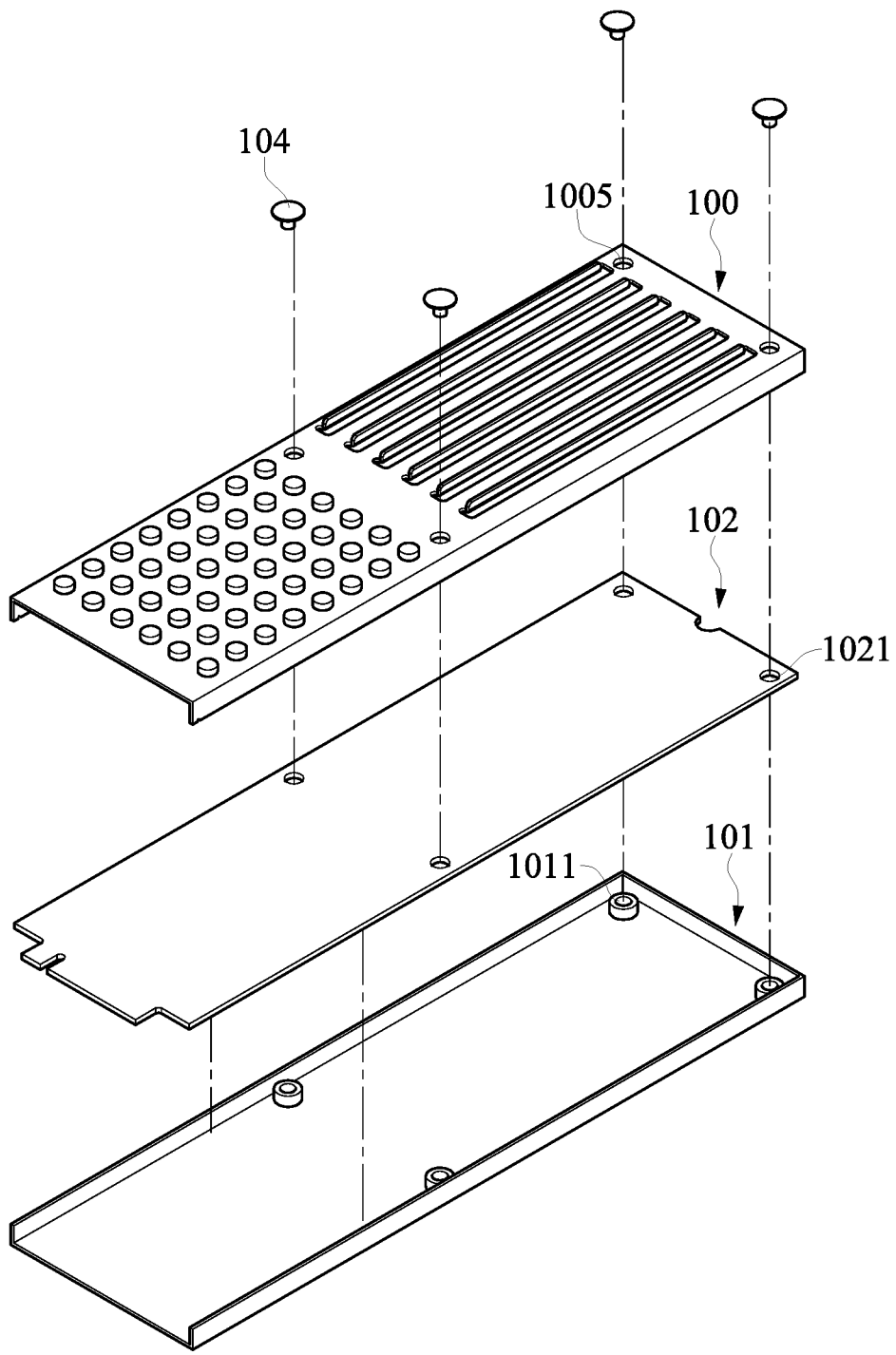
FIG. 7 is a perspective exploded view of a storage module structure according to a third embodiment of the present disclosure.

Reference is made to FIG. 7, which is a perspective exploded view of a storage module structure according to a third embodiment of the present disclosure. Reference is also made to FIG. 1 to FIG. 6. The operation of certain components of the storage module structure in this embodiment is similar to that of their counterparts in the previous embodiments, which is therefore not described herein again. It should be noted that in the present embodiment, the upper shielding component 100 has a plurality of through holes 1005, and the memory component 102 has a plurality of openings 1021 corresponding to the plurality of through holes 1005. A plurality of slots 1011 corresponding to the plurality of openings 1021 are formed on a surface of the lower shielding component 101 corresponding to the upper shielding component 101. The storage module structure 10 further includes a plurality of fastening components 104. Each fastening component 104 passes through a corresponding through hole 1005 and a corresponding opening 1021 corresponding to the through hole 1005, so as to be detachably fastened in a corresponding slot 1011.

For example, the upper shielding component 100 has the plurality of through holes 1005, and the memory component 102 has the plurality of openings 1021 corresponding to the plurality of through holes 1005. A surface of the lower shielding component 101 corresponding to the upper shielding component 100 is formed with a plurality of protrusion portions corresponding to the plurality of openings 1021. The plurality of protrusion portions are formed with a plurality of slots 1011. The slots 1011 can also be formed directly on the lower shielding component 101. The storage module structure 10 further includes a plurality of fastening components 104. The fastening components 104 may be screws, and a number of the fastening components 104 is the same as that of the openings 1021. However, the present disclosure is not limited thereto. Therefore, when assembling, the storage module structure 10 of the present disclosure can match and align the through holes 1005 with the corresponding openings 1021 and slots 1011. And then, each of the fastening components 104 passes through the corresponding through hole 1005 and the corresponding opening 1021 so as to be engaged with and fastened in a corresponding slot 1011, which in turn causes the upper shielding component 100 to be assembled with the lower shielding component, and causes the memory component 102 to be accommodated in the accommodated space 103.

Fourth Embodiment

Figure 8:
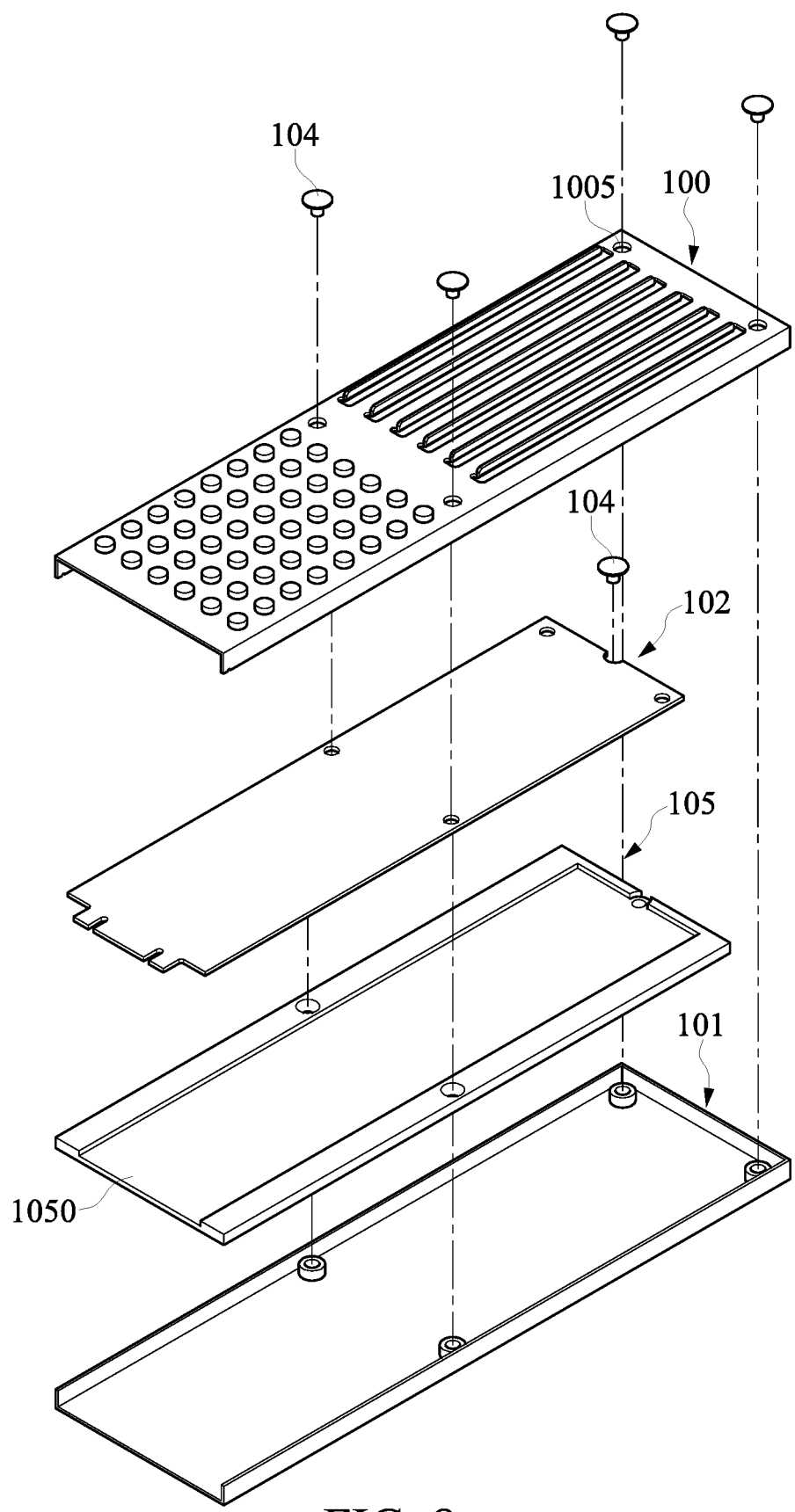
FIG. 8 is a perspective exploded view of a storage module structure according to a fourth embodiment of the present disclosure.

Reference is made to FIG. 8, which is a perspective exploded view of a storage module structure according to a fourth embodiment of the present disclosure. Reference is also made to FIG. 1 to FIG. 7. The operation of certain components of the storage module structure in this embodiment is similar to that of their counterparts in the above-referenced embodiments, which is therefore not described herein again. It should be noted that in the present embodiment, the storage module structure 10 of the present disclosure can further include a carrier component 105. A surface of the carrying component is recessed inwardly to form an installation slot 1050. A size of the installation slot 1050 can be greater than the size of the memory component 102, and smaller than the size of the accommodating space 103 inside the lower shielding component 101 (that is, the size of the installation slot 1050 is a portion of the accommodating space 103 not being labeled in the figures).

Therefore, when a size of the memory component 102 suits the installation slot 1050, the memory component 102 can be placed in the installation slot 1050 of the carrying component 105 and fastened in the installation slot 1050 through the fastening components 104. Next, the carrying component is clamped by the upper shielding component 100 and the lower shielding component 101. Each fastening component 104 passes through the corresponding through hole 1005 and the corresponding opening 1021, so as to be engaged with and fastened in a corresponding slot 1011 of the lower shielding component 101, which in turn causes the upper shielding component 100 to be assembled with the lower shielding component and the carrying component 105, and causes the memory component 102 to be accommodated in the accommodated space 103.

Another Embodiment

Figure 9:
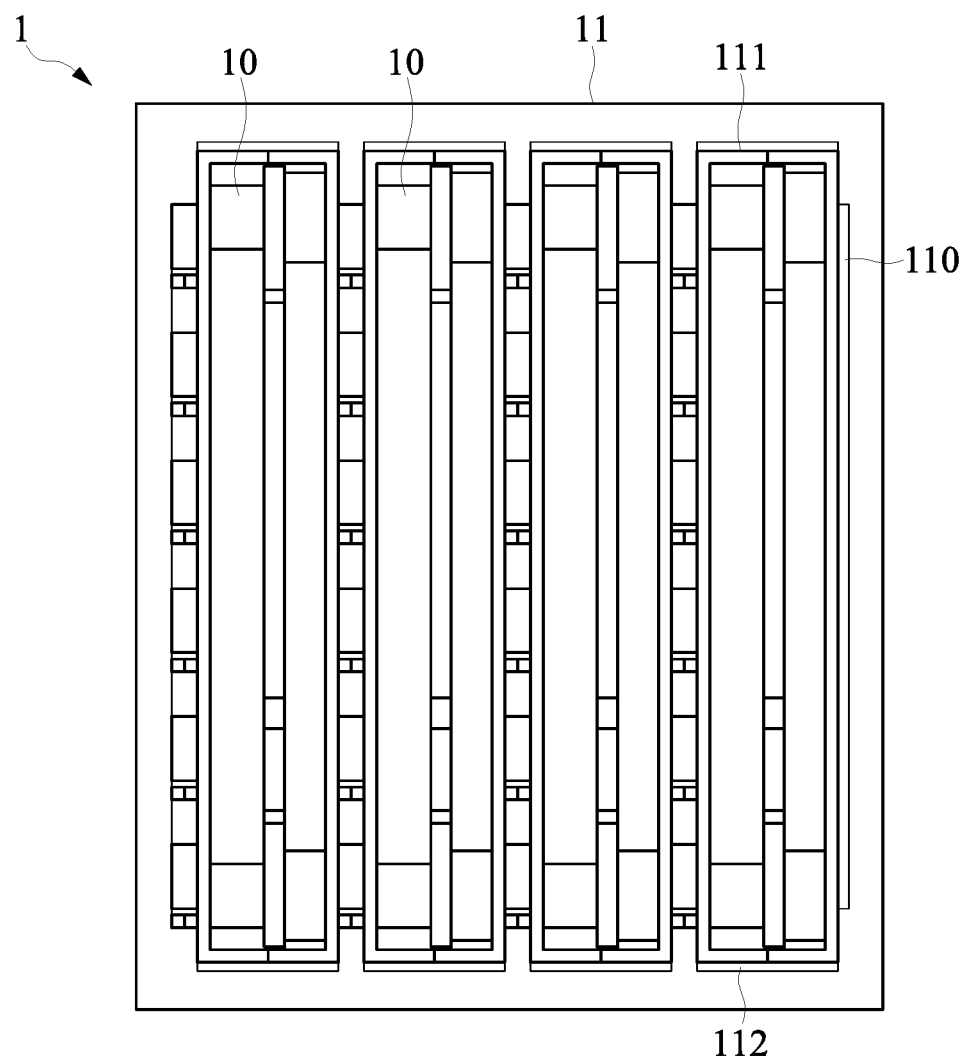
FIG. 9 is a front view of a storage module structure according to an embodiment of the present disclosure.
Figure 10:
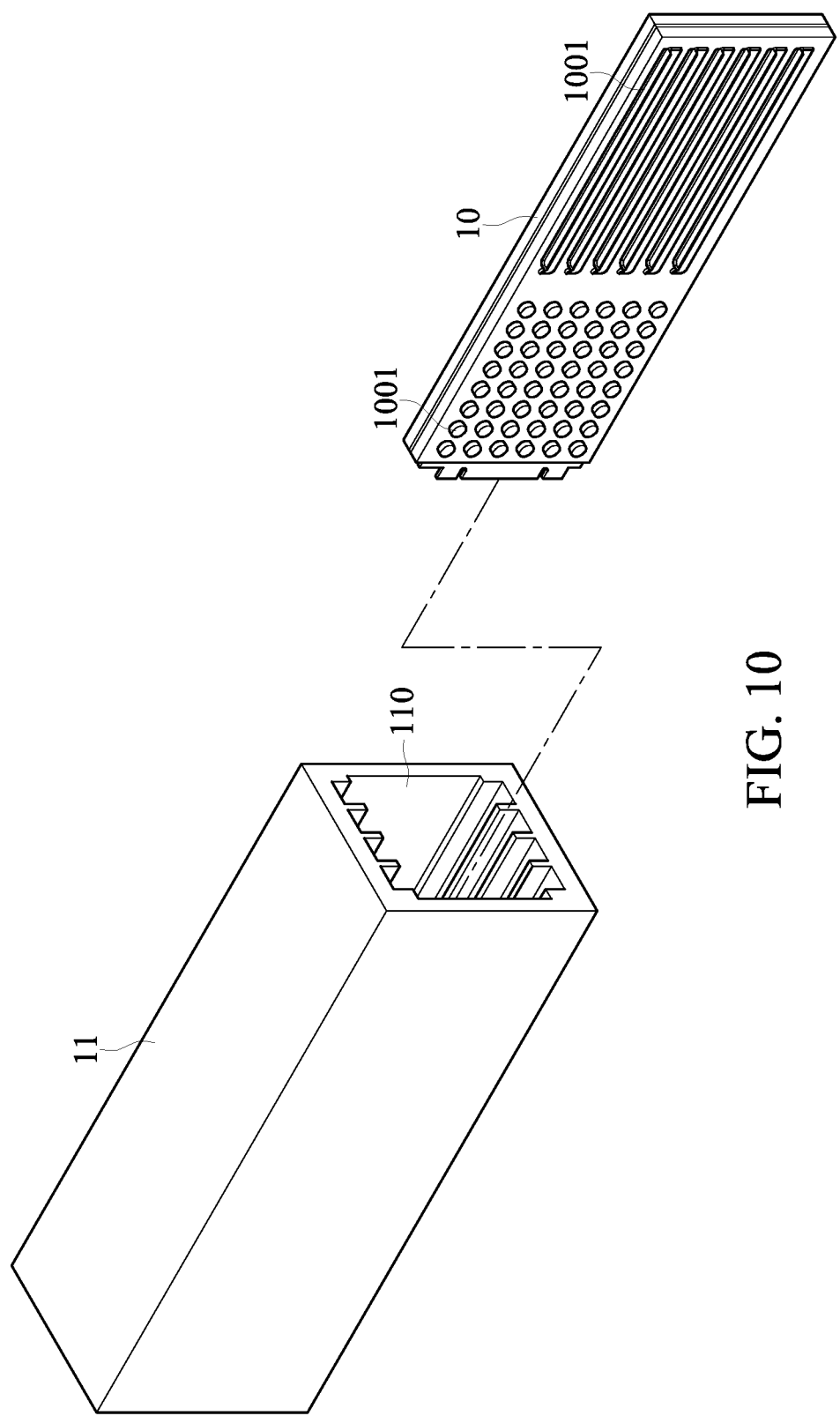
FIG. 10 is a perspective view of a storage module structure according to an embodiment of the present disclosure.

Reference is made to FIGS. 9 and 10, which are respectively a front view and a perspective view of a storage module structure according to an embodiment of the present disclosure. Reference is also made to FIG. 1 to FIG. 8. The operation of certain components of the storage module structure in this embodiment is similar to that of their counterparts in the above-referenced embodiments, which is therefore not described herein again. It should be noted that in the present embodiment, the storage assembly 1 of the present disclosure includes an assembly body 11 and a plurality of storage module structures 10. The assembly body 11 has an accommodating space 110. The storage module structures 10 are accommodated in the accommodating space 110. Each of the storage module structures 10 is arranged adjacent to another storage module structure 10. Each storage module structure 10 includes an upper shielding component 100, a lower shielding component 101 and a memory component 102. The outer surface 1000 of the upper shielding component 100 has a plurality of protruding heat-conducting units 1001. The lower shielding component 101 is located above the upper shielding component 100, and an accommodating space 103 is defined between the upper shielding component 100 and the lower shielding component 101. The memory component 102 is located in the accommodating space 103. Every two adjacent storage module structures 10 contact each other through corresponding heat-conducting elements 1001. The upper shielding component 100 and the lower shielding component 101 of each of the storage module structure 10 receives the thermal energy generated by the memory component 102, and the thermal energy is conducted from one storage module structure 10 to another adjacent storage module structure 10 through the heat-conducting units 1001 of the upper shielding component 100.

Specifically, the storage assembly 1 of the present disclosure can be an external storage device, or a storage device installed inside a host computer. The storage assembly 1 includes an assembly body 11 and a plurality of storage module structures 10. The assembly body 11 can be a shell structure having an accommodating space 110 for accommodating a plurality of storage module structures 10. Each of the storage module structures 10 includes an upper shielding component 100, a lower shielding component 101, and a memory component 102. Each of the upper shielding component 100 and the lower shielding component 101 can be a shell structure and can be made of a material with a high thermal conductivity, such as a metal material, but not limited thereto. The memory component 102 can be a storage component of a SSD such as NGFF or NGSFF, but not limited thereto. The outer surface 1000 of the upper shielding component 100 has a plurality of outwardly protruding heat-conducting units 1001. The heat-conducting unit 1001 is in a strip shape or a cylindrical shape, but not limited thereto. In practical usage, the heat-conducting unit(s) 1001 can be a structure having a three-dimensional geometric shape. An accommodating space 103 is defined between the upper shielding component 100 and the lower shielding component 101 for accommodating the memory component 102.

Therefore, when the plurality of storage module structures 10 are accommodated in the storage space 110, they can be disposed adjacent to each other, and the heat-conducting unit(s) 1001 of one storage module structure 10 can contact another storage module structure 10. Then, during the operation of the memory component 102, through the heat-conducting unit(s) 1001 of a corresponding upper shielding component 100, the memory component 102 operating at a higher operating temperature can transfer thermal energy to the lower shielding component 101 of another storage module structure operating at a lower operating temperature and in contact with the memory component 102 operating at a higher operating temperature. Also, through a corresponding lower shielding component 101, the memory component 102 operating at a higher operating temperature can transfer the thermal energy to the heat-conducting unit(s) 1001 of another storage module structure 10 in contact with it and operating at a lower operating temperature. Therefore, the thermal energy of the storage module structure 10 operating at a higher operating temperature is guided and transferred to the storage module structure(s) 10 with a lower operating temperature, thereby improving the heat-dissipating efficiency of the storage module structures 10.

In certain embodiments, the assembly body 11 has a plurality of first grooves 111 and a plurality of second grooves 112 corresponding to the first grooves 111. Each of the plurality of storage module structures 10 passes through a corresponding first groove 111 and a second groove 112 corresponding to the first groove 111 so as to be accommodated in the accommodating space 110. Therefore, each storage module structure 10 can pass through the corresponding first groove 111 and the corresponding second groove 112 to be firmly accommodated in the accommodating space 110.

In addition, the assembly body 11 can further include a heat-dissipating module (such as a heat-dissipating fan, not shown in the figure) installed on one side of the assembly body 11. Through the operation of the heat dissipation module, the heat dissipation rate of the storage module structure 10 in the accommodating space 110 can be increased.

It is worth mentioning that the storage assembly 1 of the present disclosure can further have embodiments as detailed in the above-referenced embodiments and FIGS. 1 to 8.

In certain embodiments, the heat-conducting unit(s) 1001 is in the strip shape or cylindrical shape. The upper shielding component 100 has the first heat-dissipating region 100A and the second heat-dissipating region 100B, and the heat-conducting unit(s) 1001 located in the first heat-dissipating region 100A is in the strip shape, and the heat-conducting unit(s) 1001 located in the second heat-dissipating region 100B is in the cylindrical shape.

In certain embodiments, the heat-conducting unit 1001 is elongated or shaped as a strip, and the outer surface 1000 of the upper shielding component 100 further has at least one opening 1002. The at least one opening 1002 is adjacent to at least one heat-conducting unit 1001, and the at least one opening 1002 exposes the memory component 102.

One of the beneficial effects of the present disclosure is that, through the technical features of "the outer surface 1000 of the upper shielding component 100 has a plurality of protruding heat-conducting units 1001," "the thermal energy generated by the memory component 102 is conducted to the external structure 2 through the contact of the plurality of heat-conducting units 1001 with the external structure 2," and "the upper shielding component 100 and the lower shielding component 101 of each storage module structure 10 receive the thermal energy generated by the memory component 102, and the thermal energy is conducted away from one storage module structure 10 to another adjacent storage module structure 10 through the plurality of heat-conducting units 1001 of the upper shielding component 100," the storage module structure 10 and the storage assembly 1 can significantly lower the operating temperature of the memory component 102, increase the heat-dissipating efficiency of the storage module structure 10 and the storage assembly 1, and prevent an operating efficiency of the memory component 102 from being affected by overheating.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A storage module structure, comprising:
    an upper shielding component having an outer surface formed with a plurality of protruding heat-conducting units;
    a lower shielding component located above the upper shielding component,
    wherein an accommodating space is defined between the upper shielding component and the lower shielding component; and
    a memory component located in the accommodating space,
    wherein the plurality of heat-conducting units are in contact with an external structure to form a connection of the outer surface, the plurality of heat-conducting units, and the external structure in series, and a thermal energy generated by the memory component is conducted to the external structure through the contact of the plurality of heat-conducting units.

2. The storage module structure according to claim 1, wherein the plurality of heat-conducting units are in a strip shape or cylindrical shape.

3. The storage module structure according to claim 1, wherein the upper shielding component has a first heat-dissipating region and a second heat-dissipating region, each of the first heat-dissipating region and the second heat-dissipating region is formed with at least one heat-conducting unit, the at least one heat-conducting unit in the first heat-dissipating region is in a strip shape, and the at least one heat-conducting unit in the second heat-dissipating region is in a cylindrical shape.

4. The storage module structure according to claim 1, wherein at least one of the heat-conducting units is in a strip shape, the outer surface of the upper shielding component is further formed with at least one opening adjacent to the at least one heat-conducting unit, and the at least one opening exposes the memory component.

5. The storage module structure according to claim 1, wherein the upper shielding component further has an inner wall surface facing the lower shielding component and formed with a plurality of first engaging portions protruding toward the lower shielding component;
wherein the memory component has a plurality of openings respectively corresponding to the plurality of first engaging portions;
wherein a surface of the lower shielding component corresponding to the inner wall surface is formed with a plurality of second engaging portions protruding toward the inner wall surface, and the plurality of second engaging portions respectively correspond to the plurality of openings; and
wherein each of the first engaging portions is configured to detachably engage a corresponding second engaging portion through a corresponding opening.

6. The storage module structure according to claim 1, wherein the upper shielding component is formed with a plurality of through holes, the memory component is formed with a plurality of openings, the plurality of openings correspond to the plurality of through holes;
wherein a surface of the lower shielding component corresponding to the upper shielding component is formed with a plurality of slots corresponding to the plurality of openings; and
wherein the storage module structure further includes a plurality of fastening components, each fastening component is configured to pass through a corresponding one of the through holes and a corresponding one of the openings so as to be detachably fastened in a correspond one of the slots.

7. A storage assembly, comprising:
an assembly body having a first accommodating space; and
a plurality of storage module structures disposed in the first accommodating space and adjacent to each other, each comprising:
an upper shielding component having an outer surface formed with a plurality of protruding heat-conducting units;
a lower shielding component located above the upper shielding component, wherein a second accommodating space is defined between the upper shielding component and the lower shielding component; and
a memory component located in the second accommodating space,
wherein every two adjacent storage module structures contact each other through corresponding heat-conducting units, the upper shielding component and the lower shielding component receive a thermal energy generated by the memory component, and the thermal energy is conducted from one storage module structure to another adjacent storage module structure through the heat-conducting units of the upper shielding component.

8. The storage assembly according to claim 7, wherein the assembly body has a plurality of first grooves and a plurality of second grooves corresponding to the first grooves, and each of the storage modules structures passes through a corresponding one of the first grooves and a corresponding one of the corresponding second grooves so as to be fastened in the first accommodating space.

9. The storage assembly according to claim 7, wherein the plurality of heat-conducting units are in a strip shape or cylindrical shape, the upper shielding component has a first heat-dissipating region and a second heat-dissipating region, each of the first heat-dissipating region and the second heat-dissipating region is formed with at least one heat-conducting unit, the at least one heat-conducting unit in the first heat-dissipating region is in a strip shape, and the at least one heat-conducting unit in the second heat-dissipating region is in a cylindrical shape.

10. The storage assembly according to claim 7, wherein at least one of the heat-conducting units is in a strip shape, the outer surface of the upper shielding component is further formed with at least one opening adjacent to the at least one heat-conducting unit, and the at least one opening exposes the memory component.

* * * * *